United States Patent
Lee

(10) Patent No.: US 7,267,167 B2
(45) Date of Patent: Sep. 11, 2007

(54) FIN FOR A HEAT SINK, HEAT SINK AND METHOD FOR MANUFACTURING A HEAT SINK

(75) Inventor: Phon Quan Lee, Sanchong (TW)

(73) Assignee: Cooler Master Co., Ltd (TW)

( * ) Notice: Subject to any disclaimer, the term of this patent is extended or adjusted under 35 U.S.C. 154(b) by 0 days.

(21) Appl. No.: 11/492,093

(22) Filed: Jul. 25, 2006

(65) Prior Publication Data

US 2007/0039726 A1    Feb. 22, 2007

(30) Foreign Application Priority Data

Aug. 17, 2005   (TW)   .............................. 94128008 A

(51) Int. Cl.
    *F28F 1/30*   (2006.01)
(52) U.S. Cl. .................. 165/182; 165/104.33
(58) Field of Classification Search ........... 165/104.33, 165/151, 182
    See application file for complete search history.

(56) References Cited

U.S. PATENT DOCUMENTS

| | | | | |
|---|---|---|---|---|
| 1,902,350 A | * | 3/1933 | Whitaker | ..................... 165/79 |
| 1,960,955 A | * | 5/1934 | Recker | ..................... 165/182 |
| 3,443,634 A | * | 5/1969 | Pasternak | ................... 165/182 |
| 6,640,888 B1 | * | 11/2003 | Horng et al. | ............... 165/185 |
| 6,725,909 B1 | * | 4/2004 | Luo | ...................... 165/104.21 |
| 6,729,385 B1 | * | 5/2004 | Huang et al. | ............. 165/80.3 |
| 6,749,011 B2 | * | 6/2004 | Horng et al. | .............. 165/80.3 |
| 2004/0026073 A1 | * | 2/2004 | Alex et al. | ................... 165/182 |
| 2005/0039890 A1 | * | 2/2005 | Lee et al. | ............. 165/104.33 |
| 2006/0108104 A1 | * | 5/2006 | Li | ......................... 165/104.33 |

FOREIGN PATENT DOCUMENTS

| | | | |
|---|---|---|---|
| GB | 1038556 A | * | 8/1966 |
| JP | 03233297 A | * | 10/1991 |

* cited by examiner

*Primary Examiner*—Allen J. Flanigan
(74) *Attorney, Agent, or Firm*—Hershkovitz & Associates; Abe Hershkovitz

(57) ABSTRACT

A method for manufacturing a heat sink has steps of providing multiple fins and a heat pipe, assembling the fins, mounting a thermal-conductive medium, attaching the heat pipe, heating the thermal-conductive medium, rotating the fins and cooling the thermal-conductive medium. Because the thermal-conductive medium is inserted in the cavities in the fins before the heat pipe extends through the fins, inserting the thermal-conductive medium is easy and convenient.

5 Claims, 7 Drawing Sheets

FIN FOR A HEAT SINK, HEAT SINK AND METHOD FOR MANUFACTURING A HEAT SINK

BACKGROUND OF THE INVENTION

1. Field of the Invention

The present invention relates to a heat radiator, and more particularly to a fin for a heat sink, a heat sink and a method for manufacturing a heat sink that securely attaches multiple fins to a heat pipe.

2. Description of Related Art

Computer hardware is developed rapidly to provide a high calculating performance. The processing unit on the computer hardware is designed to include more and more transistors in order to improve the calculating performance of the computer hardware. However, the heat radiated from the processing unit increases as the number of the transistors rises. Therefore, a heat radiator is usually mounted to the computer hardware to dissipate the heat from the processing unit and prevent the processing unit from burning.

Conventional heat radiators for the computer hardware are classified into water-cooling and air-cooling types. A water-cooling heat radiator has a water pump and a water tank. However, mounting the water pump and water tank to the computer hardware is complicated. Furthermore, the water pump and the water tank have considerable volumes and are incompact. Moreover, the water in the water-cooling heat radiator may leak out to damage the computer hardware. Therefore, most users adopt the air-cooling heat radiators instead of water-cooling heat radiator.

A convention air-cooling heat radiator has a metal heat sink with a thermal conductivity, contacting a processing unit chip and dissipating the heat from the processing unit chip. Furthermore, an improved air-cooling heat radiator further has a heat pipe extending through fins of the heat sink and including liquid inside the heat pipe to quickly dissipate the heat from the processing unit chip.

With reference to FIGS. 6 and 7, another heat sink comprises multiple fins (2), multiple heat pipes (1) and multiple wires (6). Each fin (2) has multiple mounting holes (3) defined through the fin (2) and multiple wire holes (5) defined through the fin (2) and communicating with the mounting hole (3). The heat pipes (1) are made of copper and respectively extend through the mounting holes (3) in each fin (2). The wires (6) may be made of tin, silver or copper and respectively extend through the wire holes (5) in each fin (2) and are melted to securely mount the heat pipes (1) and the fins (2) together.

The wires (6) are melted by heating all of the fins (2), heat pipe (1) and wires (6) to rise the temperature of the whole heat sink to the melt point of the wires (6). However the heat pipes (1) are easily melted and break when the heat pipes (1) and wires (2) are all made of copper.

With reference to FIG. 8, another heat sink comprises multiple fins (41), a heat pipe (45), solder paste and a base (46). Each fin (41) has a mounting hole (44) defined through the fin (41) and a slot (43) defined through the fin (41) and communicating with the mounting hole (44). The heat pipe (45) is made of copper, extends through the mounting holes (44) in the fins (41) and is mounted on the base (46). The solder paste is smeared into the slots (3) in the fins (43) after the heat pipe (45) extends through the mounting holes (44). The sold paste is melted by heating the fins (41) and heat pipe (45) to securely mount the heat pipe (45) in the fins (41). The solder paste has a melt point lower than that of the copper heat pipe (45) so the heat pipe (45) does not melt when heating.

However, the slots (44) are small so smearing the solder paste in the slots (44) is difficult. Incomplete smear of the solder paste in the slots (44) causes the heat pipe (45) insecurely mounted in the fins (41) when the solder paste melted.

To overcome the shortcomings, the present invention provides a fin for a heat sink, a heat sink and a method for manufacturing a heat sink to mitigate or obviate the aforementioned problems.

SUMMARY OF THE INVENTION

The main objective of the invention is to provide a method for manufacturing a heat sink that securely attaches multiple fins to a heat pipe.

A method for manufacturing a heat sink in accordance with the present invention comprises steps of providing multiple fins and a heat pipe, assembling the fins, mounting a thermal-conductive medium, attaching the heat pipe, heating the thermal-conductive medium, rotating the fins and cooling the thermal-conductive medium.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
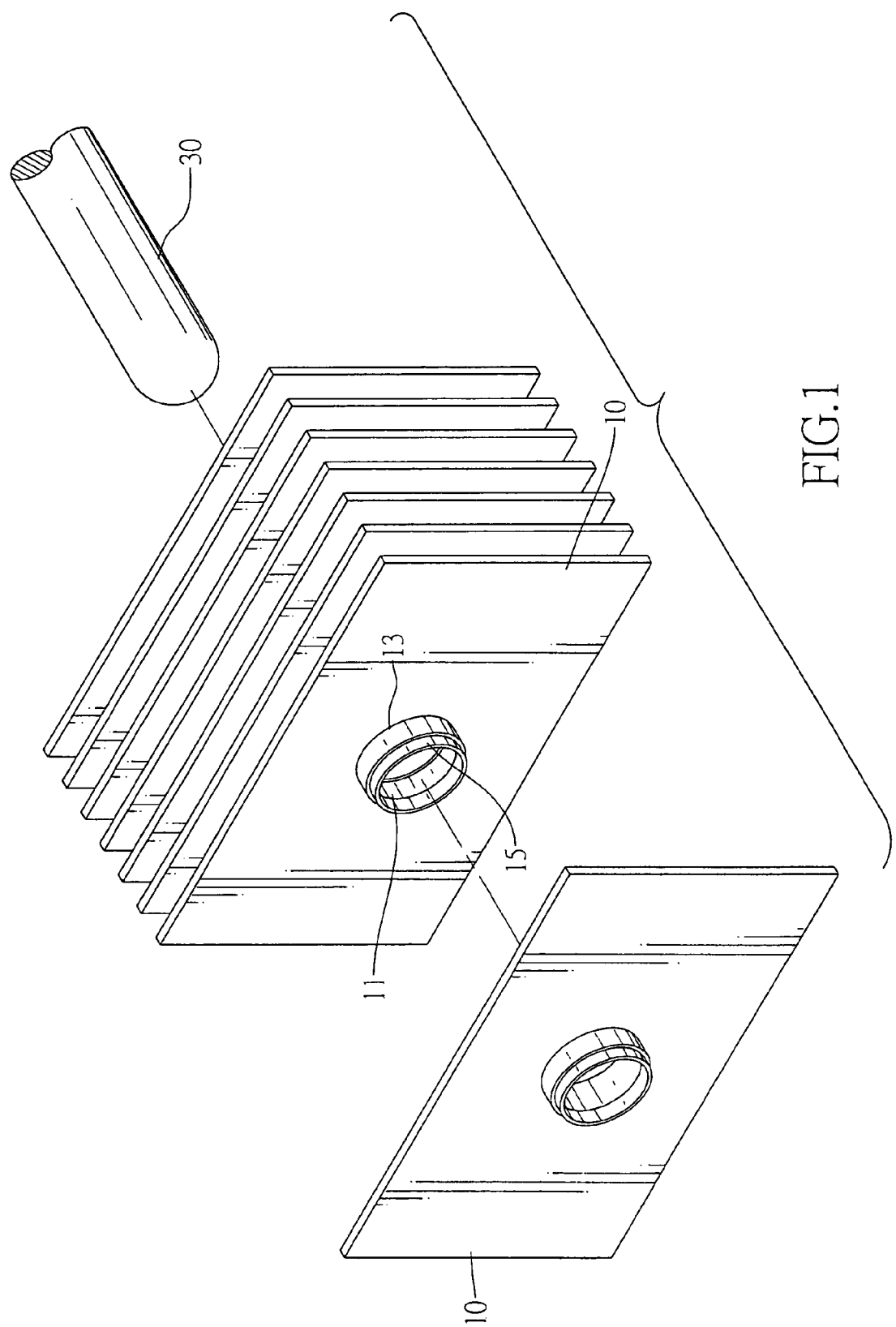
FIG. 1 is an exploded perspective of a beat sink in accordance with the present invention.

With reference to FIG. 1, a method for manufacturing a heat sink in accordance with the present invention attaches multiple fins (10) to a heat pipe (30) to form a heat sink.

Figure 2:
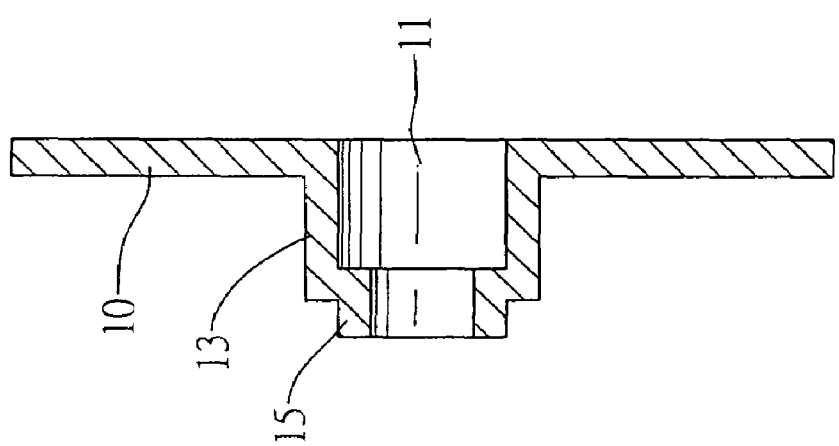
FIG. 2 is a cross sectional side view of a fin for the heat sink in FIG. 1.

With further reference to FIG. 2, each fin (10) has a through hole (11), an annular flange (13) and a second annular flange (15). The through hole (11) is defined through the heat sink (10). The first annular flange (13) is formed on fin (10) around the through hole (11), extends out from the fin (10) and has a central hole, an inner surface and a cross section. The central hole is defined through the first annular flange (13). The cross section may be circular or oval. The second annular flange (15) is formed on the inner surface of the first annular flange (10), extends out from the first annular flange (10) and has an inner surface and a cross section. The cross section of the second annular flange (15) may be circular or oval. An outer diameter of the second annular flange (15) is identical to an inner diameter of the first annular flange (13). A length of the second annular flange (15) is smaller than a length of the first annular flange (13).

The heat pipe (30) has an outer surface and an outer diameter corresponding to an inner diameter of the second annular flange (15) so the heat pipe (30) may contact the inner surface of the second annular flange (15). The heat pipe (30) has a cross section that may be circular or oval and corresponds to the cross sections of the first annular flange (13) and second annular flange (15).

The method for manufacturing a heat sink comprises steps of providing multiple fins and a heat pipe, assembling the fins, mounting a thermal-conductive medium, attaching the heat pipe, heating the thermal-conductive medium, rotating the fins and cooling the thermal-conductive medium.

Providing multiple fins and a heat pipe comprises providing multiple fins (10) and a heat pipe (30). The fins (10) are identical to the aforementioned fins (10) and each fin (10) has a through hole (11), a first annular flange (13) and a second annular flange (15). The heat pipe (30) is identical to the aforementioned heat pipe (30).

Figure 3:
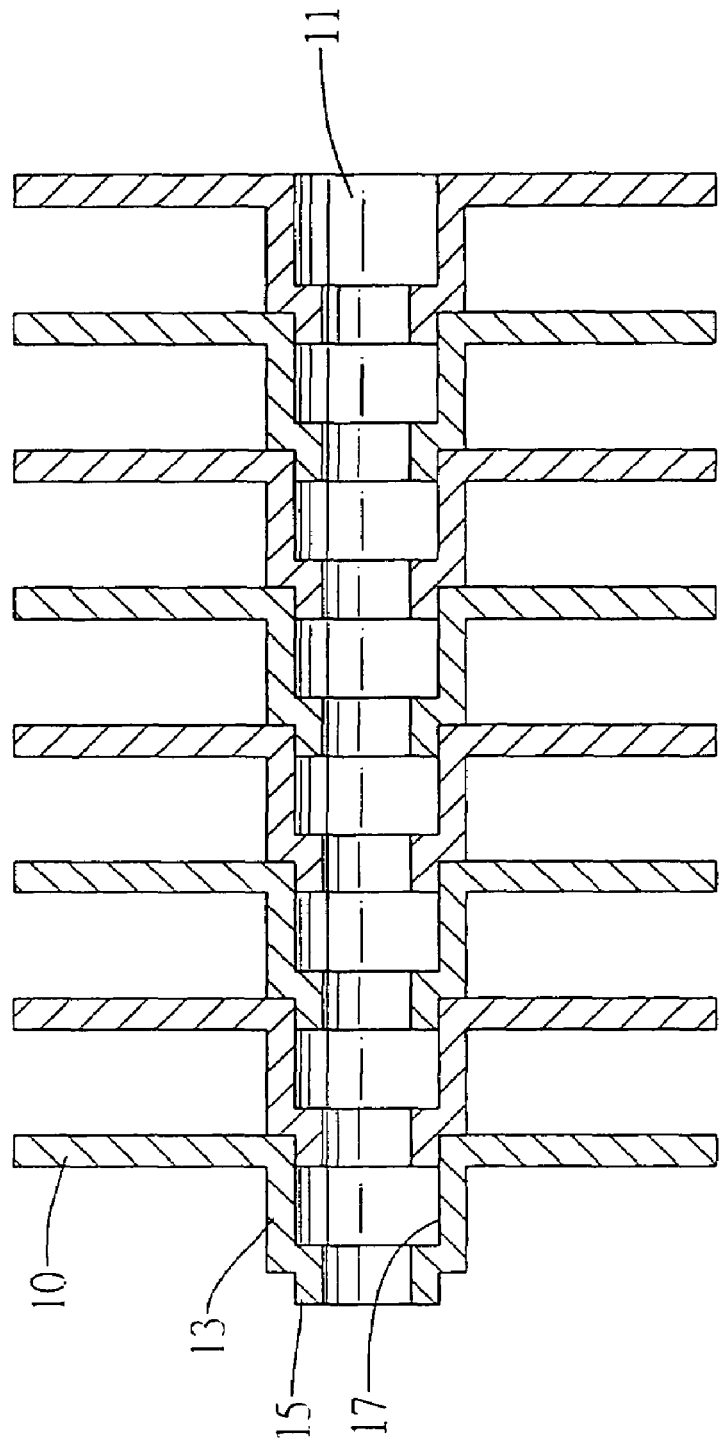
FIG. 3 is a cross sectional side view of multiple fins for the semi-finished heat sink in FIG. 1 being mounted together and arranged abreast.

With reference to FIG. 3, assembling the fins comprises assembling and mounting the fins (10) together by inserting the second annular flange (15) of one of adjacent fins (10) in the central hole of the first annular flange (13) of the other of the adjacent fins (10) to define multiple cavities (17) in the fins (10).

Figure 4:
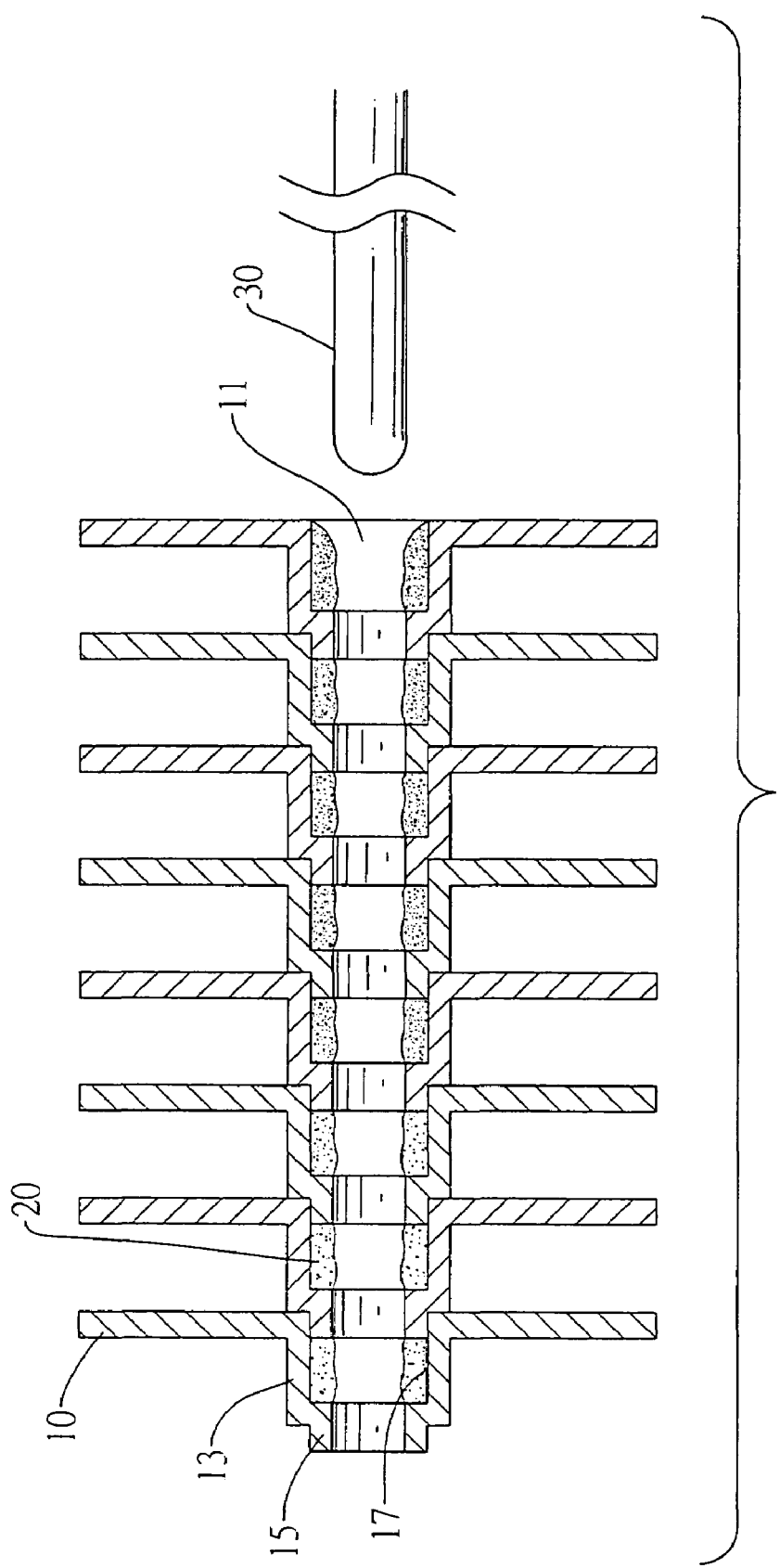
FIG. 4 is an exploded side view in partial section of the fins for the semi-finished heat sink in FIG. 3 with the solder paste and the heat pipe.

With reference to FIG. 4, mounting a thermal-conductive medium comprises mounting a thermal-conductive medium in the cavities (17) in the fins (10). The thermal-conductive medium is selected from gold, silver, solder and a mixture thereof.

Figure 5:
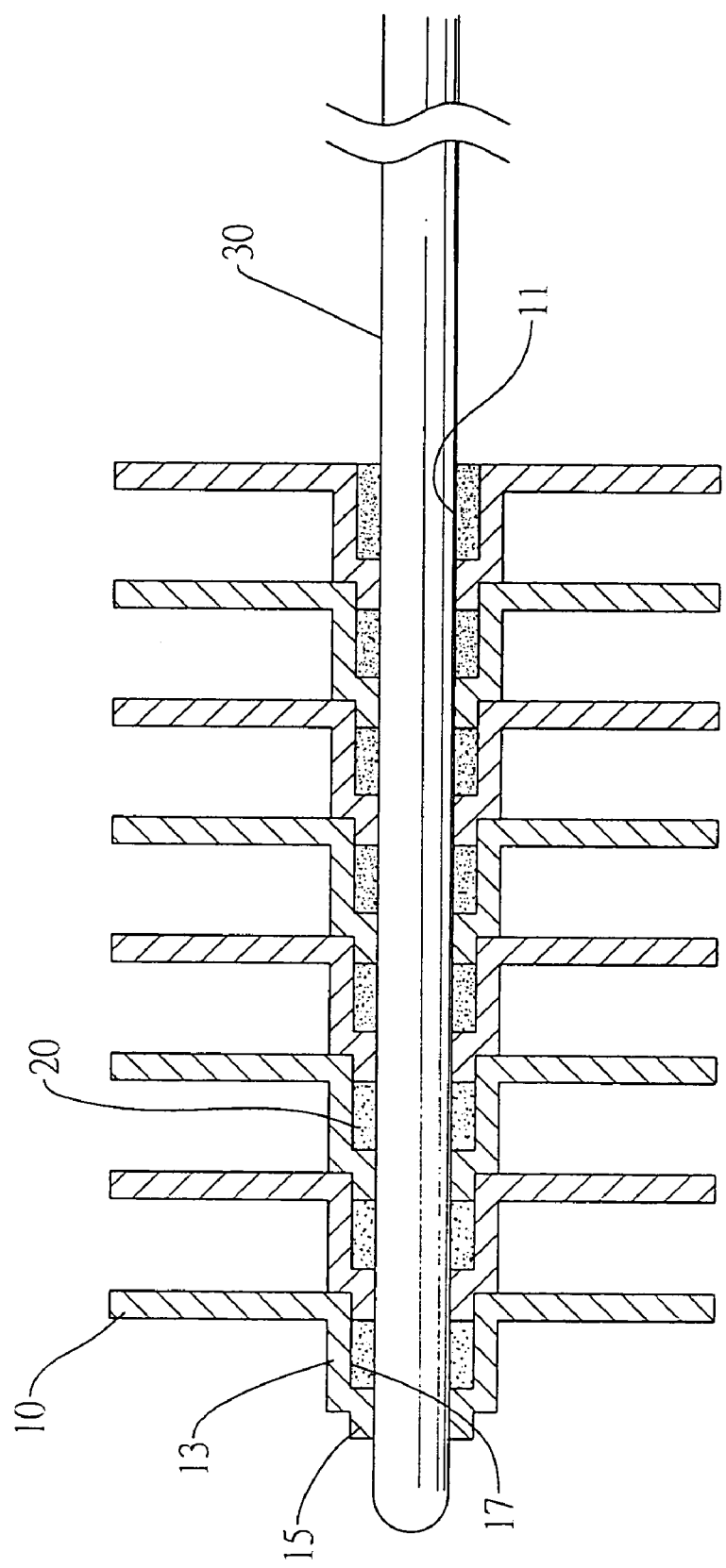
FIG. 5 is a side view in partial section of the finished heat sink in FIG. 1.
Figure 6:
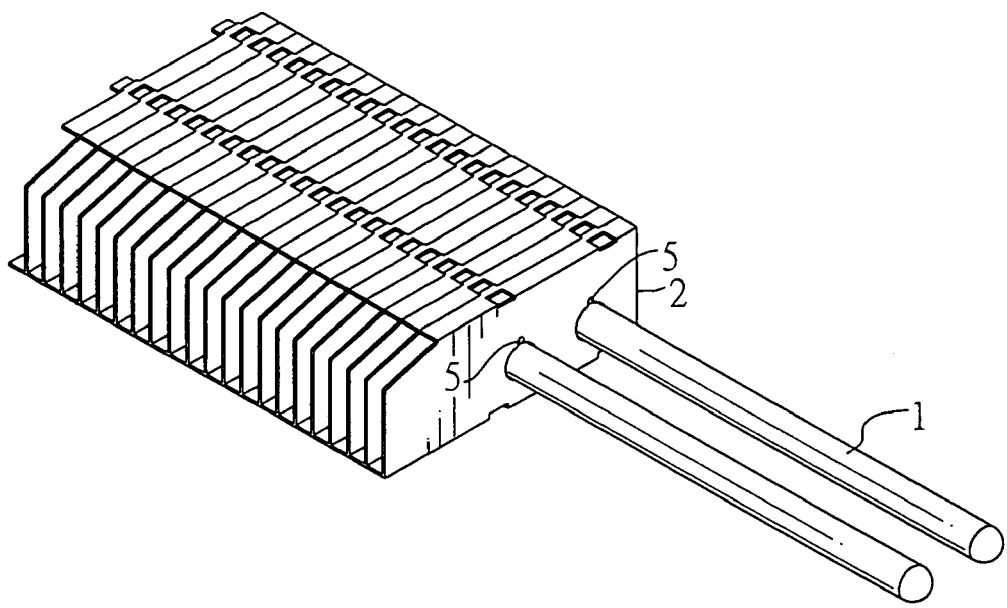
FIG. 6 is a perspective view of a conventional heat sink of Taiwan patent No. 491517.
Figure 7:
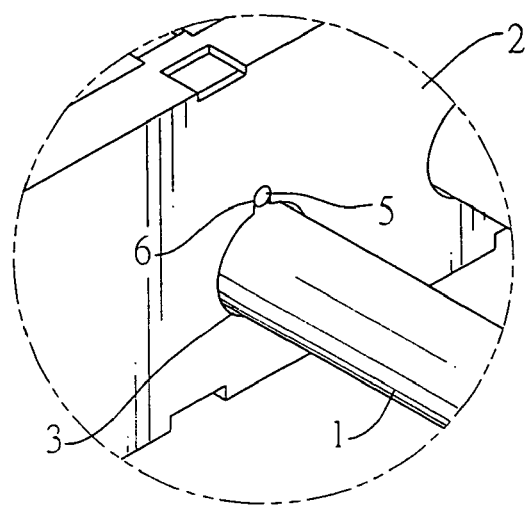
FIG. 7 is a partially enlarged perspective view of the conventional heat sink of Taiwan patent No. 491517.
Figure 8:
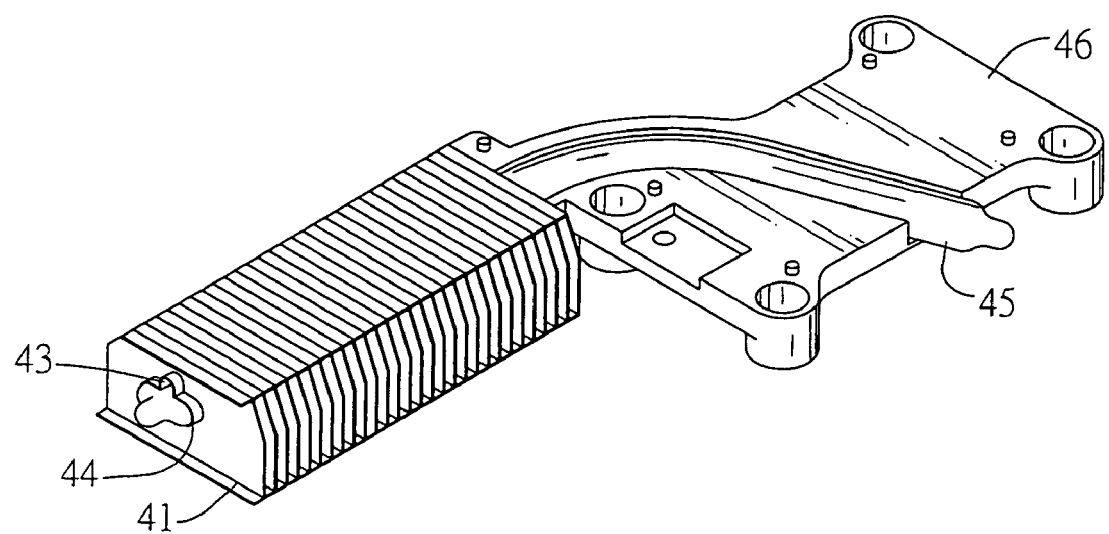
FIG. 8 is a perspective view of a conventional heat sink of Taiwan patent No. 568261.

With reference to FIG. 5, attaching the heat pipe comprises attaching the heat pipe (30) to the fins (10) by extending the heat pipe (30) through the through holes (11) in the fins (10) with the outer surface of the heat pipe (30) contacting the inner surfaces of the second annular flanges (15).

Heating the thermal-conductive medium comprises heating and melting the thermal-conductive medium to effectively cover the inner surfaces of the first annular flanges (13) and the outer surface of the heat pipe (30).

Rotating the fins comprises rotating the fins (10) on the heat pipe (30) to cause the melted thermal-conductive medium to entirely flow through and completely cover the inner surfaces of the first annular flanges (13) and the outer surface of the heat pipe (30).

Cooling the thermal-conductive medium comprises cooling the thermal-conductive medium to securely mount the heat pipe (30) in the fins (10).

Because the thermal-conductive medium is mounted in the cavities (17) in the fins (10) before the heat pipe (30) extends through the fins (10), mounting the thermal-conductive medium is convenient and easy.

Furthermore, rotating the fins (10) causes the thermal-conductive medium to completely cover the inner surfaces of the first annular flanges (15) and the outer surface of the heat pipe (30) so the thermal conductivity between the heat pipe (30) and the fins (30) substantially increases.

Even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A heat sink comprising:
multiple fins mounted together and each fin having
a through hole defined through the fin;
a first annular flange formed on the fin around the through hole and having a central hole defined through the first annular flange and an inner surface; and
a second annular flange formed on the inner surface of the first annular flange, extending out from the first annular flange and having an inner surface, an outer diameter being identical to an inner diameter of the first annular flange and a length being smaller than a length of the first annular flange, wherein the second annular flange of one of adjacent fins is inserted in the central hole of the first annular flange of the other of the adjacent fins to define multiple cavities in the fins;
a heat pipe having an outer surface and extending through the through holes in the fins with the outer surface of the heat pipe contacting the inner surfaces of the second annular flanges; and
a thermal-conductive medium mounted in the cavities in the fins and covering the inner surfaces of the first annular flanges and the outer surface of the heat pipe.

2. The heat sink as claimed in claim 1, wherein the thermal-conductive medium is selected from gold, silver, solder and a mixture thereof.

3. A method for manufacturing a heat sink comprising steps of:
providing multiple fins and a heat pipe comprising providing multiple fins and a heat pipe, and each fin having a through hole defined through the fin, a first annular flange formed on the fin around the through hole and having a central hole defined through the first annular flange and an inner surface and a second annular flange formed on the inner surface of the first annular flange, extending out from the first annular flange and having an inner surface, an outer diameter being identical to an inner diameter of the first annular flange and a length being smaller than a length of the first annular flange;
assembling the fins comprising assembling the fins by inserting the second annular flange of one of adjacent fins in the central hole of the first annular flange of the other of the adjacent fins to define multiple cavities in the fins;
mounting a thermal-conductive medium comprising mounting a thermal-conductive medium in the cavities in the fins;
attaching the heat pipe comprising attaching the heat pipe to the fins by extending the heat pipe through the through holes in the fins with the outer surface of the heat pipe contacting the inner surfaces of the second annular flanges;
heating the thermal-conductive medium comprising heating and melting the thermal-conductive medium to cover the inner surfaces of the first annular flanges and the outer surface of the heat pipe; and
cooling the thermal-conductive medium comprising cooling the thermal-conductive medium to securely mount the heat pipe in the fins.

4. The method as claimed in claim 3, wherein the thermal-conductive medium is selected from gold, silver, solder and a mixture thereof.

5. The method as claimed in claim 3, wherein a step of rotating the fins is before the step of cooling the thermal-conductive medium and comprises rotating the fins on the heat pipe to cause the melted thermal-conductive medium to flow through and completely cover the inner surfaces of the first annular flanges and the outer surface of the heat pipe.

* * * * *